United States Patent
Block et al.

Patent Number: 6,033,766
Date of Patent: *Mar. 7, 2000

[54] GRAY SCALE MASK AND DEPTH PATTERN TRANSFER TECHNIQUE USING INORGANIC CHALCOGENIDE GLASS

[75] Inventors: Barry Block, Los Altos; Arnold O. Thornton, San Jose; Jan Ingwersen, San Francisco; Walter Daschner, Half Moon Bay, all of Calif.

[73] Assignee: Aerial Imaging Corporation, San Jose, Calif.

[*] Notice: This patent is subject to a terminal disclaimer.

[21] Appl. No.: 09/228,910

[22] Filed: Jan. 11, 1999

Related U.S. Application Data

[63] Continuation of application No. PCT/US98/09373, May 15, 1998, which is a continuation-in-part of application No. 08/857,324, May 16, 1997.

[51] Int. Cl.[7] .............................. B32B 3/00; B32B 15/00; G03F 9/00
[52] U.S. Cl. .......................... 428/210; 428/432; 428/434; 430/5; 430/296
[58] Field of Search .................. 430/5, 270.1, 270.11, 430/296, 299, 310, 313, 317, 321, 323, 564; 438/93, 95; 428/209, 210, 432, 433, 434; 216/51

[56] References Cited

U.S. PATENT DOCUMENTS

| | | | |
|---|---|---|---|
| 4,127,414 | 11/1978 | Yoshikawa et al. | 96/67 |
| 4,320,191 | 3/1982 | Yoshikawa et al. | 430/296 |
| 4,350,541 | 9/1982 | Mizushima | 148/188 |
| 4,454,221 | 6/1984 | Chen et al. | 430/316 |
| 5,177,567 | 1/1993 | Klersy et al. | 257/4 |
| 5,314,772 | 5/1994 | Kozicki et al. | 430/14 |
| 5,480,764 | 1/1996 | Gal et al. | 430/321 |

OTHER PUBLICATIONS

Hawley's Condensed Chemical Dictionary, John Wiley & Sons, Inc. p. 89, 1997.

*Primary Examiner*—Timothy Speer
*Assistant Examiner*—Stephen Stein
*Attorney, Agent, or Firm*—Kenneth E. Leeds

[57] ABSTRACT

A method of producing a high resolution expanded analog gray scale mask is described. Using an inorganic chalcogenide glass, such as a selenium germanium, coated with a thin layer of silver, a gray scale mask may be produced with accurate control of the size, uniformity and variance of the pixels. The selenium germanium glass is composed of column structures arranged perpendicularly to the substrate giving a possible edge precision of 100 Å. The column structures also prevent undercutting during the etching process, thus permitting pixels to be placed close together. Accordingly, selenium germanium may be used as a high resolution gray scale mask with an expanded analog gray scale. The gray scale mask may be used to impress information as a modulated thickness on a selenium germanium photoresist layer on an inorganic substrate. The selenium germanium photoresist layer may then transfer the gray scale to the substrate.

50 Claims, 4 Drawing Sheets

GRAY SCALE MASK AND DEPTH PATTERN TRANSFER TECHNIQUE USING INORGANIC CHALCOGENIDE GLASS

The present application is a continuation of PCT patent application PCT/US98/09373, filed May 15, 1998, which is a continuation-in-part of U.S. patent application Ser. No. 08/857,324, filed May 16, 1997.

FIELD OF THE INVENTION

This invention relates to the manufacture of gray scale masks and depth pattern transfer procedures. More specifically this invention relates to the use of an inorganic chalcogenide glass to produce a high resolution and expanded analog gray scale mask and to transfer information from the gray scale mask to a substrate.

BACKGROUND

Gray scale masks are useful in manufacturing various three dimensional mechanical, electrical and optical devices. For instance, gray scale masks are used to produce sophisticated geometrical structures or topographies necessary for creating mechanical structures, particular electrostatic field configurations, or optic structures. Gray scale masks may be used in micro-optic devices to produce well defined complex topologies used in refractive and diffractive optical elements. For example, gray scale masks may be used to produce small diffractive lenses, such as a blazed phase zone plate lens, for use in an optical head, as disclosed in U.S. patent application Ser. No. 08/833,608, entitled "Optical Head with a Diffractive Lens," by B. Block and A. Thornton, filed Apr. 11, 1997, which is herein incorporated by reference.

A gray scale mask is a two dimensional surface with varying optical transmissibility. The variations of the optical transmissibility represent three dimensional information, e.g., a height profile or depth pattern. The gray scale mask is used to transfer the three dimensional information to a resist layer on a substrate by photoexposure and development which leaves a modulated resist thickness. The three dimensional information now contained in the thickness modulated resist layer may subsequently be transferred into the substrate by known etching processes, thereby creating the desired depth pattern in the substrate. The resulting processed substrate then contains, as a physical contour, the three dimensional information that was originally represented by the variations of the optical transmissibility of the gray scale mask.

Gray scale masks are generally made out of a transparent substrate such as glass covered by an opaque, easily etched metallic layer. Chrome is often used because, among other reasons, it is easily deposited and etched. A gray scale can be created by the repetition of dots or pixels that appear as transparent holes in the chrome mask, as for example described in "One-step 3D Shaping Using a Gray-Tone Mask for Optical and Microelectronic Applications," Y. Oppliger et al., Microelectronic Engineering 23, p. 449 (1994); and in "One-Level Gray-Tone Lithography—Mask Data Preparation and Pattern Transfer," K. Reimer, et al., SPIE Vol. 2783, p.71, 1996, both of which are incorporated herein by reference. Conversely, a gray scale may be created by placing opaque pixels on a clear field. Until recently, there has been little need for extremely high resolution, expanded analog gray scale masks. An analog gray scale is expanded by making the pixels smaller while, if necessary, placing the pixels very close together, which is useful because it can more closely approximate a continuous transmissibility in the x-y plane. However, high resolution expanded analog gray scale masks are now in demand, for instance, to make a high resolution lens for a flying slider in an optical head as discussed in U.S. patent application Ser. No. 08/833,608.

The materials presently used in gray scale masks are responsible for the practical limitations on the resolution of the gray scale mask. For instance, with the use of direct electron beam (e-beam) writing, small geometric areas may be written upon, approximately 0.02 microns in line width. Chrome, however, which is commonly used in gray scale masks, does not permit the same resolution. Chrome is an isotropic material, and therefore when liquid etched, suffers from problems associated with isotropic etching, most notably undercutting. Undercutting is undesirable because the resolution of a gray scale mask and its accurate representation of three dimensional information are ultimately determined by the accuracy of the size, uniformity and variance of the pixels. These parameters are limited by the edge precision permitted by the material used in the gray scale mask. Because pixels, which are either transparent holes or opaque dots, are defined by their edges, an imprecise edge on a small pixel can drastically alter the size of the pixel. The undercutting process is difficult to control. Thus, there is limited accuracy of the size, uniformity and variance of the pixels in isotropic gray scale masking materials, such as chrome. Additionally, undercutting restricts the proximity of one pixel from another, which limits the extension of the analog gray scale. The rate of lateral etching in isotropic materials is approximately the same as the downward etching rate. Accordingly, in a chrome gray scale mask, the minimum distance between two pixels is approximately twice the thickness of the resist. This limitation is particularly detrimental in creating an extended analog gray scale mask.

Undercutting, which occurs in a wet etch process, may be avoided with dry chrome etching. The dry etch process, however, has other undesirable effects. Dry etching causes uncontrolled redeposition and thus, material may be unintentionally placed over pixels. Dry etching also damages the mask and substrate materials. Damage to the mask material may create unwanted holes or extra pixels in the mask, while damage to the substrate may interfere with the gray scale mask's transparency to light.

Gray scale masks made from chrome also suffer from light transmission problems, such as interference, standing waves, and scattered light. These problems are caused by the reflectivity of the chrome, and the surfaces created during the etching process, and may cause fluctuations in irradiation at different depths in the resist.

One response to the demand for higher resolution expanded analog gray scale masks is to use high energy beam sensitive glass (HEBS) as described in U.S. Pat. No. 5,078,771, issued to C. Wu on Jan. 7, 1992, which is incorporated herein by reference. Although HEBS glass can produce a high quality gray scale mask, to date, HEBS glass is not a standard commercially available glass, and therefore is difficult to obtain. The HEBS glass is an unusual formulation of a glass substrate and requires specialized treatment and is therefore expensive to manufacture Additionally, HEBS glass is unavailable to be optimized for specific requirements. The HEBS glass becomes opaque to deep UV radiation, giving a limit to its usable wavelength. Thus, HEBS glass is an unsatisfactory wide band ultraviolet transparent substrate for gray scale masks.

SUMMARY

A readily available inorganic chalcogenide glass, such as selenium germanium, may be used to produce a high resolution gray scale mask. In one embodiment, a layer of selenium germanium, that can be either sputtered or vacuum evaporated over a substrate, comprises a series of columns arranged perpendicularly to the substrate. The column structures allow control over the edge definition to within a single column diameter, approximately 10 nm. The column structures also prevent undercutting during the etching process, particularly when wet etchant is used. Thus, a high resolution expanded analog gray scale mask may be produced using a chalcogenide glass, such as selenium germanium, to accurately control the size, uniformity and variance of the pixels.

A gray scale mask may be created by covering a substrate with a selenium germanium layer which is then coated with a thin layer containing silver. The silver diffuses into the selenium germanium layer when written upon by ultraviolet light, x-rays or an electron beam. The irradiated areas of the selenium germanium layer, which are photodoped with silver, are then insoluble in alkaline solutions. Accordingly, the non-irradiated areas may be removed by simply etching the non-diffused silver in an acid solution, followed by removing the underlying selenium germanium layer in an alkaline solution. The silver photodoped selenium germanium will remain behind creating an extremely accurate gray scale mask.

Several phenomena occur which makes selenium germanium a superior material for high resolution gray scale masks. One phenomenon known as apodization occurs at the boundary of edges due to the exposed column structures at the edges of the pixels. Apodization increases resolution because interference is damped out. Selenium germanium also has a high light absorption rate which eliminates standing wave effects. Additionally, there is an edge-sharpening effect caused by the diffusion of the silver into the selenium germanium.

A chalcogenide glass gray scale mask may be used to impress information as a continuously varying, modulated thickness on an organic photoresist or an inorganic chalcogenide glass photoresist which is deposited on an inorganic substrate. Using a chalcogenide glass photoresist, one can take advantage of both the high resolution of the chalcogenide resist and the compatibility of the inorganic resist with the inorganic substrate. The inorganic resist may then easily transfer its the gray scale information into the substrate.

In an alternative embodiment, the selenium-germanium is dry-etched instead of wet-etched. In such an embodiment, the selenium-germanium need not include a columnar structure.

DETAILED DESCRIPTION

Figure 1:
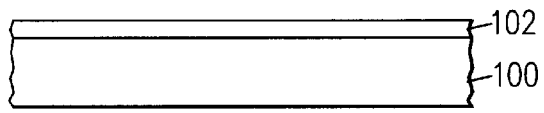
FIGS. 1–6 are simplified cross-sectional views of a mask substrate undergoing a method of creating a gray scale mask on an inorganic chalcogenide glass according to the present invention.

A gray scale mask uses variable optical transmissibility as a two dimensional representation of three dimensional data, such as height profiles or depth patterns. The information on a gray scale mask is recorded as small dots or pixels of various size and pitch, i.e., the number of pixels per unit area. There are three ways in which pixels may be used to form a gray scale: (1) pulse width modulation, which uses pixels of different size but constant pitch; (2) pulse density modulation, which uses pixels of constant size but different pitch; or (3) a combination of pulse width modulation and pulse density modulation. These methods are well understood in the art and need not be explained further.

Another way of fabricating a gray scale mask is using a thickness modulation of an optically absorbing layer. For example, one can make a thickness-modulated (as opposed to a pixel-modulated) gray scale mask.

The accuracy and resolution of the gray scale mask depends upon the control of the size, uniformity, and variance of the pixels. These properties are limited by the control over the precision of the edges of the pixels. Because pixels are defined by their edges, irregular edges on pixels may dramatically alter the area of the pixel, particularly if the pixel is small. In addition, in order to achieve an expanded analog gray scale, one must have the process freedom to place the pixels both far and. in close proximity to each other.

An inorganic chalcogenide glass has properties that make it a superior material for creating a high resolution expanded analog gray scale mask. Chalcogenide glass is a substance that contains one of the chalcogens, such as selenium, tellurium, or sulfur, along with a more electropositive element, such as germanium. Thus, chalcogenide glass includes materials such as Se—Ge, Se—S—Ge, Se—Te—Ge, and Se—Sn—Ge. When deposited over a substrate in a thin layer, e.g., below three microns, chalcogenide glass has a structure that comprises a series of columns, each with a diameter of approximately 10 nm. The column structures are arranged perpendicularly to the substrate and impede undercutting from the side during etching. Due to the lack of undercutting and the small diameter of the columns, the edge may be etched in Se—Ge with a precision of approximately 10 nm. Accordingly, chalcogenide glass permits the creation of very small and precise pixels.

A layer of the inorganic chalcogenide glass, for instance, a Se—Ge layer of 20% Se/80% Ge by atomic weight, becomes a negative type photoresist/masking material through photodoping with silver (Ag). This process of photodoping Se—Ge with Ag is discussed in "A New Inorganic Electron Resist of High Contrast," A. Yoshikawa, et al., Applied Physics Letters, Vol. 31, No. 3, p. 161, Aug. 1, 1977, which is incorporated herein by reference; and "Bilevel High Resolution Photolithographic Technique for Use with Wafers with Stepped and/or Reflecting Surfaces," K. L. Tai, et al., Journal of Vacuum Science Technology, Vol. 16, No. 6, p. 1977, November/December 1979, which is incorporated herein by reference.

After depositing a Se—Ge layer on a transparent substrate by RF sputtering or vacuum evaporation, a thin layer of Ag, approximately 10 nm thick, is applied over the Se—Ge layer. The Ag layer may be deposited by dipping the Se—Ge layer into an aqueous solution of $AgNO_3$. When written on with an e-beam, x-rays, or ultraviolet light, the irradiated Ag diffuses into the Se—Ge column structures, which makes the irradiated areas insoluble in alkaline solutions, such as KOH. The non-irradiated Ag may then be etched off with an acid solution, such as $HNO_3$—HCl—$H_2O$, which will uncover the underlying Se—Ge layer. The now uncovered, undoped Se—Ge layer may then be removed using an alkaline solution, such as $NH_4OH$, KOH, or NaOH. The Ag photodoped Se—Ge layer, which corresponds to the area irradiated with the e-beam, x-rays or ultraviolet light, is not affected by the alkaline solution. Thus, a gray scale mask is created with the Ag-diffused Se—Ge layer remaining as a negative of the gray scale pattern on the substrate. The gray scale mask may be used with the Ag-diffused Se—Ge layer, or the gray scale pattern may then be etched into the gray scale mask substrate using known etching means, such as reactive ion etching, chemically assisted ion beam etching, or ion milling.

With the use of a high resolution writing mechanism, such as an e-beam, a gray scale pattern may be transferred to the full thickness of a layer of Se—Ge, with virtually no undercutting and with an edge precision of 10 nm. Because there is virtually no undercutting, the Se—Ge layer can make a gray scale with pixels that are closer together than possible in an isotropic material, such as chrome. The Se—Ge material, permits the control of the size, uniformity, variance, and proximity of the pixels that is necessary to produce superior high resolution expanding analog gray scale masks.

The use of an inorganic chalcogenide glass to create a high resolution gray scale mask has other advantages as well. For instance, Se—Ge has a high rate of light absorption, e.g., $2.5 \times 10$ $cm^{-1}$ at 400 nm, which leads to the elimination of standing waves. Thus, Se—Ge avoids the adverse side effects caused by standing waves, such as fluctuations in illumination at different depths in the resist. In addition, a process called apodization occurs at the edges of the pixels. Apodization is where interference is damped out because of uneven geometric structures, such as the column structures found in the Se—Ge glass. Also, the rapid diffusion of Ag from irradiated to non-irradiated areas causes an edge-sharpening effect, which compensates for diffraction effects. This phenomenon is discussed in "Multilayer Resists for Fine Line Optical Lithography," by E. Ong and E. L. Hu, Solid State Technology, p. 155, June 1984, which is incorporated herein by reference.

Additionally, a Se—Ge layer is conformal so that it may be applied over a substrate with steps or a complex surface topology without loss in resolution. The deposition of Se—Ge does not require liquid spin on, which is advantageous because of environmental concerns. Further, Se—Ge may be deposited on a substrate that is transparent to wide band ultraviolet light. This is advantageous because the smaller wavelengths of light will allow smaller pixels to be formed. Also, the materials used in the etching process, such as sodium hydroxide, are easily controllable and relatively environmentally safe compared to the materials used to etch some organic resists.

Accordingly, an inorganic chalcogenide glass, such as Se—Ge, is superior to an isotropic material, such as chrome, for producing a high resolution gray scale mask, particularly when the pixel size is extremely small coupled with the use of an expanded analog gray scale.

The Se—Ge gray scale mask can be used to transfer information to an organic resist on an inorganic substrate as a step toward transferring the gray scale information into the substrate itself. Instead of using an organic resist, however, an inorganic chalcogenide glass can also be used as a positive type photoresist. Thus, the gray scale mask may impress information upon a Se—Ge layer as a modulated thickness, which is then transferred to the inorganic substrate.

The use of a Se—Ge chalcogenide glass as a positive type photoresist is discussed in "New Application of Se—Ge glasses to Silicon Microfabrication Technology," H. Nagai, et al., Applied Physics Letters, Vol., 28, No. 3, p. 145, Feb. 1, 1976, which is incorporated herein by reference; and "A Novel Inorganic Photoresist Utilizing Ag Photodoping in Se—Ge Glass Films," A. Yoshikawa, et al., Applied Physics Letters, Vol. 29, No. 10, p. 677, Nov. 15, 1976, which is incorporated herein by reference.

Se—Ge layers have a selective etching effect which is useful as a positive photoresist. Photoexposed Se—Ge layer has a greater etching rate in an alkaline solution, such as NaOH—$H_2O$, KOH—$H_2O$, $NH_4OH$—$H_2O$, or $(CH_3)_2NH$, than non-exposed Se—Ge layer. Thus, a Se—Ge layer deposited on a transparent substrate, such as fused silica, and without an overlaying Ag layer, may be illuminated with a pattern of light from the gray scale mask. When the Se—Ge layer is etched in an alkaline solution, the areas that received a greater photon dose etch away faster than the areas that received a lesser photon dose. Thus, a layer of Se—Ge resist with a modulated thickness will remain after etching. The modulated thickness may be transferred to the substrate itself through known methods, such as reactive ion etching, chemically assisted ion beam etching, or ion milling. The inorganic chalcogenide resist is more compatible with an inorganic substrate material than an organic resist. Thus, there are fewer difficulties with increasing temperatures which cause resist flow and other problems during the ion etching process.

The gray scale mask can be made with a Se—Ge layer without the Ag layer as described above. In such an embodiment, the Se—Ge layer acts as a positive type photoresist/masking material for the gray scale mask.

Further, the gray scale mask may also transfer its pattern to a negative type photoresist, by placing an Ag layer over the chalcogenide glass resist. This embodiment requires the extra process of etching away the non-irradiated Ag in an acid solution, followed by etching the undoped Se—Ge layer in an alkaline solution.

As shown in FIG. 1, The process of making a gray scale mask with an inorganic chalcogenide resist is started by depositing a Se—Ge layer 102 upon a transparent substrate 100, such as quartz or fused silica glass. The inorganic layer 102 may also be composed of other chalcogenide glasses, such as Se—S—Ge, Se—Te—Ge or Se—Sn—Ge. Se—Ge layer 102 can be deposited by vacuum evaporation or RF sputtering in an Ar atmosphere at room temperature. Sputtering, however, produces superior adhesion. The composition of Se—Ge layer 102 is approximately $Se_{80}$ and $Ge_{20}$ by atomic weight, although the composition range is not critical. The thickness of Se—Ge layer 102 is approximately, 300 nm, but may range from approximately 30 to 3000 nm.

Figure 2:
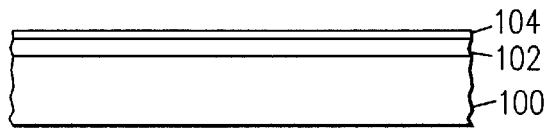

A thin Ag layer 104, approximately 10 nm, is deposited over Se—Ge layer 102, as shown in FIG. 2. (In an alternative embodiment, layer 104 is a material that contains silver, but need not be pure silver.) One method of depositing Ag layer 104 is through immersion of substrate 100 with Se—Ge layer 102 into an aqueous solution containing Ag, such as $AgNO_3$, at room temperature.

Figure 3:
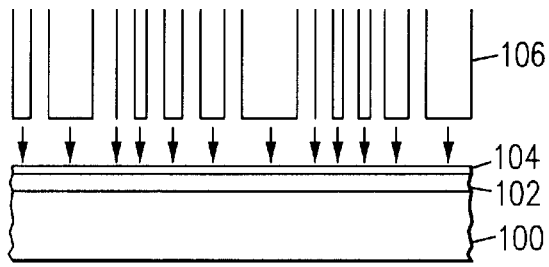

The gray scale pattern, using a combination of pulse width modulation and pulse density modulation, is directly written on Ag layer 104 with an e-beam 106, as shown in FIG. 3. The e-beam irradiation can be accomplished using techniques that are known in the art. As shown in FIG. 3, the width of e-beam 106 changes according to the desired photon dose. However, a gray scale pattern may also be created using only pulse width modulation or pulse density modulation. Of course, in order to achieve the desired final depth pattern in the substrate, calibration and process optimization procedures must be used to create the proper gray scale pattern. These procedures, however, are well known in the art and need not be discussed in more detail.

Figure 4:
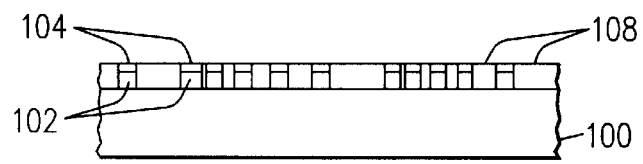

The e-beam writing causes Ag diffusion into Se—Ge layer 102, creating an Ag—Se—Ge layer 108 at the irradiated areas, as shown in FIG. 4. The Ag—Se—Ge layer 108 is insoluble in alkaline solutions.

Figure 5:
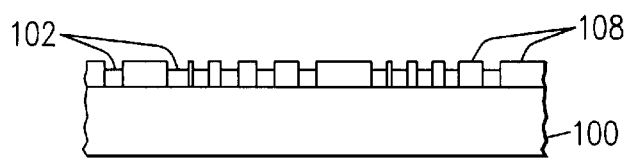

As shown in FIG. 5, the Ag layer 104 on the non-irradiated areas is removed by etching with an acid solution, such as $HNO_3$—$HCl$—$H_2O$, $H_2SO_4$—$H_2O_2$—$H_2O$, or $HCl$—$H_2O$—$H_2O$, thereby uncovering the underlying undoped Se—Ge layer 102. (In an alternative embodiment, the Ag on the non-irradiated areas can be removed by other techniques such as reactive ion etching with $CF_4$, $CF_4$ plus $O_2$, or $C_2F_6$ plus $O_2$.)

Figure 6:
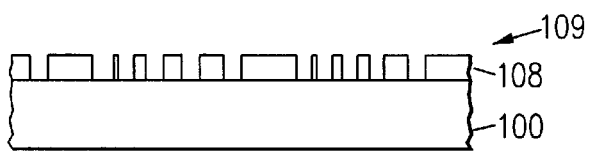

The uncovered Se—Ge layer 102, which is undoped, may then be etched using KOH—$H_2O$, as shown in FIG. 6. Other alkaline solutions, such as NaOH—$H_2O$, $NH_4OH$—$H_2O$, or $(CH_3)_2NH$, may also be used. (In addition, the uncovered Se—Ge layer can be removed by other techniques such as reactive ion etched using $C_2F_6$ plus $O_2$.) Thus, Ag—Se—Ge layer 108 is left on substrate 100, creating a gray scale Se—Ge mask 109.

Figure 7:
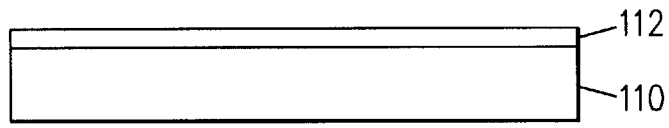
FIGS. 7–10 are simplified cross-sectional views of a substrate lens undergoing a method transferring depth pattern information from a gray scale mask to the lens substrate using an inorganic chalcogenide glass resist according to the present invention.

The depth pattern information on gray scale Se—Ge mask 109 may then be transferred onto a substrate, for instance to create a lens, as follows. As shown in FIG. 7, a lens substrate 110, such as fused silica glass, is covered with a Se—Ge resist 112, in the manner described above.

Figure 8:
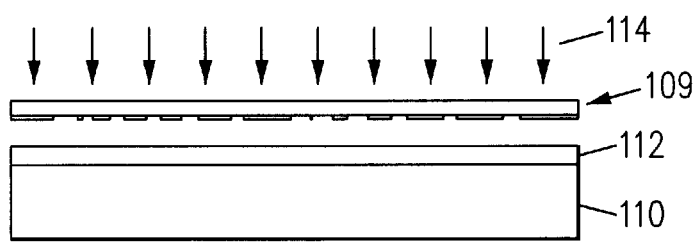

Gray scale Se—Ge mask 109 is used to illuminate Se—Ge resist 112 using a conventional mask aligning instrument with a light source 114 as shown in FIG. 8. Alternative methods of illumination are well known in the art and are also possible. Additionally, a gray scale mask made of chromium or other materials may also be used while still receiving the advantage of using a chalcogenide glass photoresist.

Figure 9:

Next, Se—Ge resist 112 is etched in an aqueous solution of KOH. The areas of the Se—Ge resist 112 that received a greater photon dose dissolve at a higher rate than areas that received a smaller photon dose. Thus, after etching a thin layer of Se—Ge resist 112 is left with a modulated thickness proportional to the received photon doses, as shown in FIG. 9.

Figure 10:
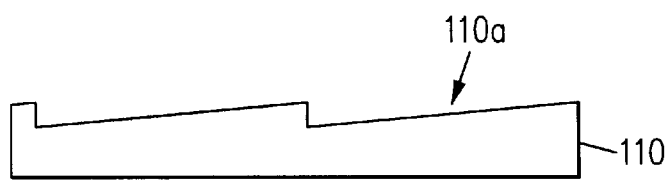

Finally, substrate 110 is etched using a conventional process, such as reactive ion etching. Alternatively, chemically assisted ion-beam etching, ion milling or a combination of the three may be used. Because both Se—Ge resist 112 and substrate 110 are inorganic compounds, there is a reproducible relationship between the rate of etching of layer 112 and substrate 110 with which the optimized gray scale mask yields the desired profile. Additionally, concerns about the effects of resist flow and other undesirable problems caused by temperature build-up are minimized. As shown in FIG. 10, the pattern from gray scale Se—Ge mask 109 is transferred onto substrate 112.

Figure 10A:
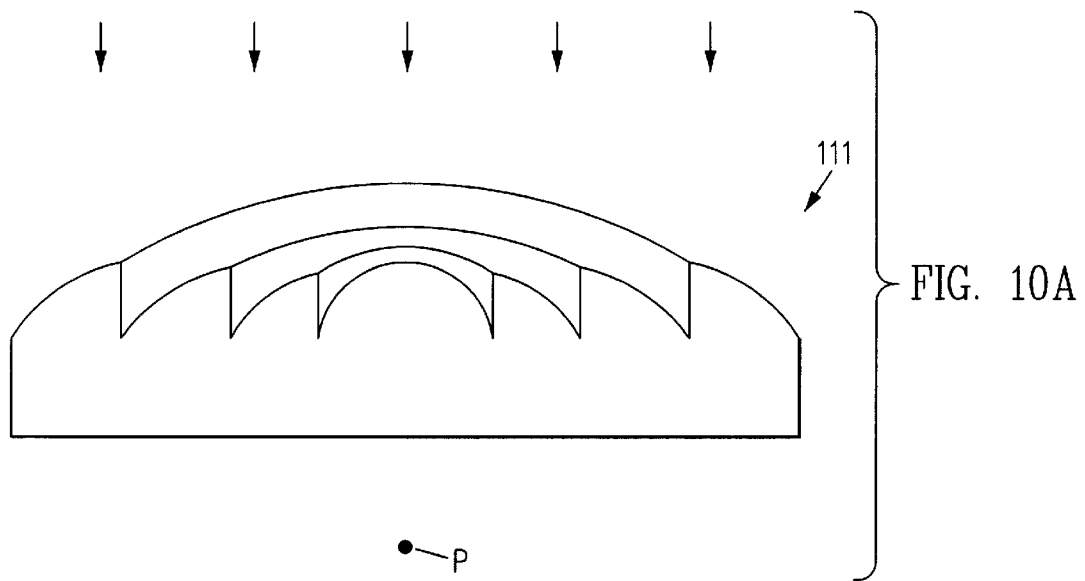
FIG. 10A is a front perspective half sectional view of a zone plate lens constructed using a method in accordance with the invention.

As seen in FIG. 10, the top surface of substrate 110 includes a three-dimensional pattern. This pattern may be a blazed zone plate lens, e.g. as shown in cross section in FIG. 10. A more complete view of this blazed zone plate lens is shown in FIG. 10A. During use, light passes through the zone plate lens 111 and is focused onto a small point P. As described in the above-incorporated application Ser. No. 08/833,608, the lens of FIG. 10A can be part of a read head or a read-write head used in a magneto-optic or optical disk drive. This lens can be mass-produced by lithographic techniques. In other embodiments, work-pieces other than lenses can be formed using the gray scale mask of our invention. In such workpieces, substrate 110 can comprise either a homogenous body of material or it may comprise several layers of different materials.

As seen in FIG. 10, the top surface 110a of substrate 110 follows the slope of the top surface 112a of Ge—Se layer 112, which in turn was defined by the density of pixels in mask 109 (FIG. 8). The greater the density of pixels, or openings, in mask 109, the greater the amount of light passing therethrough to illuminate the portion of layer 112 under the pixels. The greater the amount of light illuminating a portion of Ge—Se layer 112, the less the amount of Ge—Se that will be removed during the etching of layer 112. Thus, a high portion 114 of layer 112 represents an area under a dense concentration of pixels, or openings, in mask 109. A low portion 116 of layer 112 represents an area with a low concentration of pixels or openings in mask 109.

Figure 11:
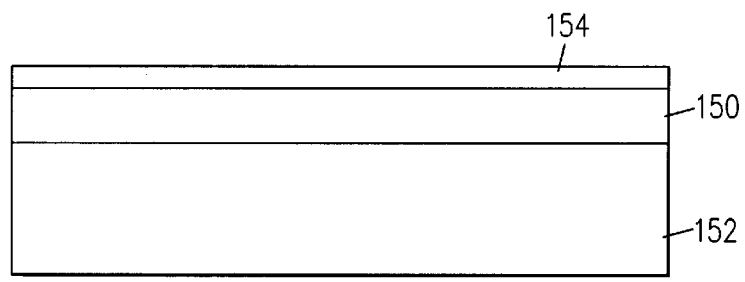
FIGS. 11–13 are simplified cross-sectional views of a method for manufacturing a gray scale mask in accordance with an alternative embodiment of our invention.
Figure 12:
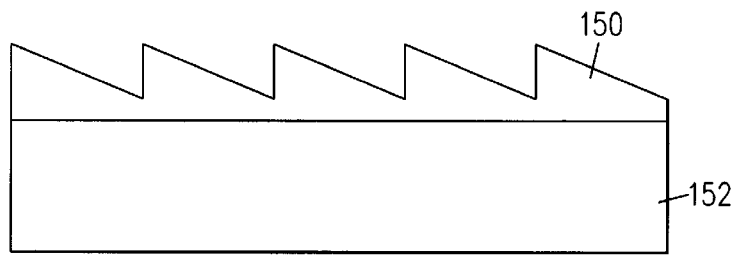
Figure 13:
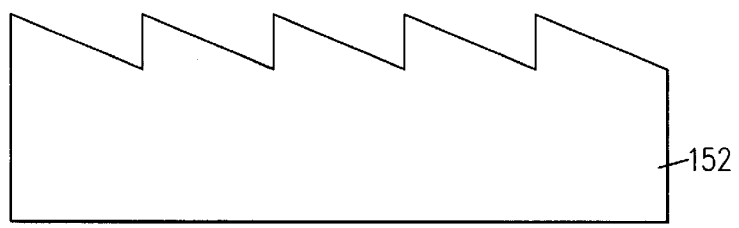

FIGS. 11–13 illustrate an alternative embodiment of our invention in which gray scale information is encoded into an e-beam by controlling the e-beam dose (e.g. coulombs/unit area) as the e-beam pattern is traced over the resist. Referring to FIG. 11, a process in accordance with this embodiment begins with the step of depositing a chalcogenide glass layer 150 onto a substrate 152. Chalcogenide glass 150 can be formed by sputtering to a thickness of about 200 nm, but other deposition techniques and thicknesses can be used as well. A 10 nm thick silver-containing layer 154, e.g. $Ag_2Se$ is then deposited onto chalcogenide glass layer 150, e.g. by immersing glass 150 in a $AgNO_3$ solution.

The structure of FIG. 11 is then exposed to an e-beam in which the dose (coulombs/unit area) is varied as the e-beam is traced over silver-containing layer 154. Because of the dose variation, the amount of silver diffusing into the chalcogenide glass varies over the surface of layer 150 in a manner that reflects the electron dose variation of the e-beam.

Referring to FIG. 12, any residual silver containing layer 154 is removed, e.g. with a $KI/I_2$ solution. In one embodiment, 74.5 gr of KI and 1.75 gr of $I_2$ are dissolved in 50 ml of water, and this solution is used to dissolve the residual silver-containing layer. (Such a process is described by Singh, et al., "Sub-50 nm Lithography in Amorphous Se—Ge Inorganic Resist by Electron Beam Exposure," Appl. Phys. Lett. Vol. 41, No. 10, pp. 1002–1004, 1982, incorporated herein by reference.)

Referring to FIG. 12, Chalcogenide glass layer 150 is then subjected to etching, e.g. by an alkaline etching solution such as KOH—$H_2O$, NaOH—$H_2O$, $NH_4OH$—$H_2O$ or $(CH_3)_2NH$ described above. (Layer 150 can also be etched by reactive ion etching, e.g. as described above.) Because the amount of silver diffused into the chalcogenide glass depends upon the electron dose from the e-beam, and the etch rate of the chalcogenide glass depends upon the amount of silver diffused therein, the profile of the surface of the chalcogenide glass at the conclusion of reactive ion etching also reflects the electron dose received during e-beam patterning, e.g. as shown in FIG. 12.

Referring to FIG. 13, the profile in layer 150 is then transferred to substrate 152. In one embodiment, this is accomplished by reactive-ion etching, using $SF_6$, $CBrF_3$, $CHF_3$ or $CF_4$ as the process gas. During this process, chalcogenide glass layer 150 is consumed. In this way, analog profile information is transferred from layer 152 to substrate 150. In one embodiment, substrate 150 can comprise a Ge layer formed on a transparent sub-layer. The Ge layer may be used as a gray scale mask in conjunction with light, UV light, or x-rays so that the profile information written into the Ge layer may be transferred to another resist layer.

In one embodiment, the profile information in the Ge layer is lithographically transferred to another resist layer (organic or inorganic), which in turn is transferred to a transparent layer such as glass or quartz. The transparent layer can then be used as a lens.

Figure 14:
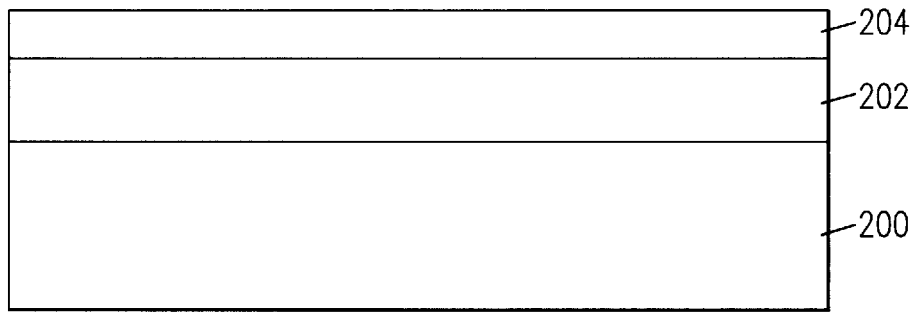
FIGS. 14–16 are simplified cross-sectional views of a method for manufacturing a mask in accordance with another embodiment of our invention.
Figure 15:
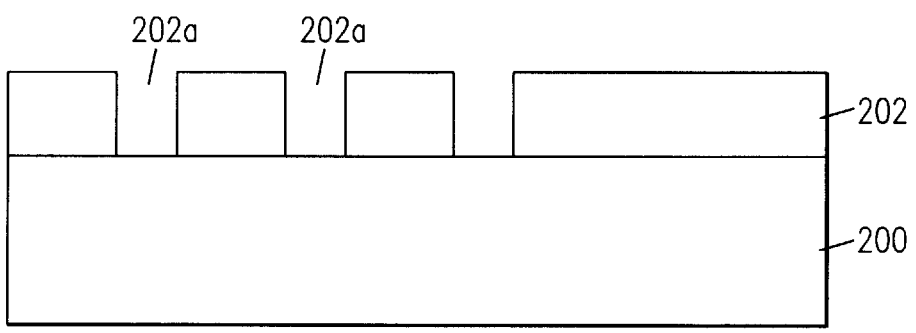
Figure 16:
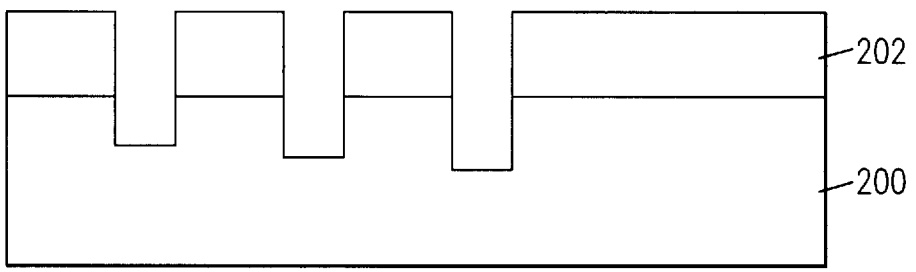

FIGS. 14–16 illustrate a modification of the above invention. In FIG. 11, substrate 200 is covered with a chalcogenide glass layer 202 and a silver-containing layer 204, e.g. as discussed above. An e-beam is used to pattern layer 204 with pixel information.

Referring to FIG. 15, silver-containing layer 204 is then removed, and the unexposed portions of chalcogenide glass layer 202 are removed by etching to form window regions 202a, thereby exposing portions of substrate 200.

Referring to FIG. 16, chalcogenide glass layer 202 is used as a mask to selectively etch the exposed portions of substrate 200. Chalcogenide glass layer 202 is then removed.

Although specific embodiments have been described and illustrated in order to explain the present invention, the present invention is not limited thereto. For example, instead of depositing a silver layer on the chalcogenide glass, a layer comprising silver can be deposited on the chalcogenide glass, e.g. a 10 nm thick layer of $Ag_2Se$. Also, the thicknesses and dimensions are merely illustrative, and other thicknesses and distances can be used.

As mentioned above, other chalcogenide glasses can be used, e.g. Ge—S, $As_2Se_3$, $As_2S_3$, or Bi-doped Ge—Se. (Bi-doped Ge—Se is discussed by Gupta et al. in "Plasma-Processed Obliquely Deposited Bi—Ge—Se and Ag/Bi—Ge—Se Films as Resist Materials", Appl. Phys. A 46, pp. 103–106 (1988), incorporated herein by reference.

In one embodiment, the gray scale mask may be created using a Se—Ge layer as a positive type photoresist/gray mask material or the depth pattern may be transferred to a substrate using a Ag—Se—Ge as a negative type photoresist. The gray scale pattern formed in Se—Ge may be transferred to the gray scale mask substrate. Additional layers of material may be deposited without losing the advantages of the present invention. Further, other ways of depositing the chalcogenide layer or the silver layers, as well as the etching of the layers and the substrate are possible and may be practiced without departing from the scope of the invention as set forth in the claims below.

We claim:

1. A method comprising:
   producing a gray scale mask, said step of producing comprising:
   depositing a chalcogenide glass on a first substrate;
   depositing a layer containing silver on said chalcogenide glass;
   selectively irradiating portions of said layer containing silver in a gray scale pattern such that silver is diffused into said chalcogenide glass in a gray scale pattern;
   etching said layer containing silver wherein the removal of silver uncovers said chalcogenide glass and the silver diffused into said chalcogenide glass is not removed; and
   etching the uncovered chalcogenide glass, wherein a layer of silver-diffused chalcogenide glass remains on said first substrate representing said gray scale pattern.

2. The method of claim 1, wherein said chalcogenide glass comprises selenium.

3. The method of claim 1, wherein said chalcogenide glass comprises germanium.

4. The method of claim 1, wherein said step of etching said layer containing silver is performed using an acid solution, and said acid solution is $HNO_3$—HCl—$H_2O$.

5. Method of claim 1, wherein said uncovered chalcogenide glass is etched in an alkaline aqueous solution comprising a hydroxide.

6. The method of claim 1, wherein said layer containing silver is irradiated with an electron beam, ultraviolet light or x-rays.

7. The method of claim 1 wherein said gray scale pattern comprises a set of pixels.

8. The method of claim 1, further comprising:
   transferring a representation of said gray scale pattern into said first substrate by etching through said layer of silver-diffused chalcogenide glass and into said first substrate.

9. The method of claim 1 further comprising:
   transferring a depth pattern, said step of transferring comprising:
   depositing a chalcogenide glass resist on a second substrate;
   placing said first substrate with said layer of silver-diffused chalcogenide glass over said chalcogenide glass resist;
   illuminating said chalcogenide glass resist through said gray scale pattern;
   etching said chalcogenide glass resist, such that a modulated thickness of chalcogenide glass resist remains; and
   transferring a representation of said modulated thickness into said second substrate by etching through said modulated thickness of chalcogenide glass resist and into said second substrate.

10. The method of claim 1 further comprising:
    transferring a depth pattern, said step of transferring comprising:
    depositing a chalcogenide glass resist on a second substrate;
    depositing a second layer containing silver on said chalcogenide glass resist;
    placing said first substrate with said layer of silver-diffused chalcogenide glass over said second layer containing silver;
    illuminating said second layer containing silver through said gray scale pattern, such that said illuminated silver is diffused into said chalcogenide glass resist as a function of said gray scale pattern;
    etching said second layer containing silver wherein the removal of silver uncovers chalcogenide glass resist and the silver diffused into said chalcogenide glass is not removed;
    etching said chalcogenide glass resist, such that a modulated thickness of silver diffused chalcogenide glass resist remains; and
    transferring a representation of said modulated thickness into said second substrate by etching through said modulated thickness of silver diffused chalcogenide glass resist and into said second substrate.

11. A method comprising:
producing a gray scale mask, said step of producing comprising:
  depositing a chalcogenide glass on a first substrate;
  irradiating said chalcogenide glass in a gray scale pattern; and
  etching said chalcogenide glass until the irradiated chalcogenide glass in said gray scale pattern is removed, leaving a layer of chalcogenide glass on said first substrate representing said gray scale pattern.

12. The method of claim 11 further comprising:
transferring a depth pattern, said step of transferring comprising:
  depositing a chalcogenide glass resist on a second substrate;
  placing said first substrate with said layer of chalcogenide glass over said chalcogenide glass resist;
  illuminating said chalcogenide glass resist through said gray scale pattern;
  etching said chalcogenide glass resist in an alkaline solution, such that a modulated thickness of chalcogenide glass resist remains; and
  transferring a representation of said modulated thickness into said second substrate by etching through said modulated thickness of chalcogenide glass resist and into said second substrate.

13. The method of claim 11 further comprising:
transferring a depth pattern, said step of transferring comprising:
  depositing a chalcogenide glass resist on a second substrate;
  depositing a second layer containing silver on said chalcogenide glass resist;
  placing said first substrate with said layer of silver-diffuse d chalcogenide glass over said second layer containing silver;
  illuminating said second layer containing silver through said gray scale pattern, such that said illuminated silver is diffused into said chalcogenide glass resist as a function of said gray scale pattern;
  etching said second layer containing silver wherein the removal of silver uncovers said chalcogenide glass resist and the silver diffused into said chalcogenide glass is not removed;
  etching said chalcogenide glass resist, such that a modulated thickness of silver diffused chalcogenide glass resist remains; and
  transferring a representation of said modulated thickness into said second substrate by etching through said modulated thickness of silver diffused chalcogenide glass resist and into said second substrate.

14. Method comprising the steps of:
forming a chalcogenide glass layer on a first substrate;
forming a silver-containing layer on said chalcogenide glass layer;
subjecting said silver-containing layer to radiation to thereby write profile information into said chalcogenide glass layer, said profile information representing a continuously varying height of the top surface of a workpiece;
removing said silver-containing layer; and
etching said chalcogenide glass layer to form a profile in accordance with said profile information in said chalcogenide glass layer representing the pattern written with said radiation.

15. Method of claim 14 further comprising the step of transferring the pattern in said chalcogenide glass layer into said substrate.

16. Method of claim 15 wherein said substrate comprises a Ge layer on a transparent layer, whereby after said step of transferring, the remaining portion of said Ge layer represents a gray scale mask.

17. Method of claim 14 wherein at the end of said step of etching said chalcogenide glass profile mimics the intensity of said radiation.

18. Method comprising the steps of:
depositing a chalcogenide glass layer on a substrate;
selectively irradiating said chalcogenide glass with radiation;
etching said chalcogenide glass to form a three-dimensional pattern in said chalcogenide glass, the thickness of the chalcogenide glass varying as a function of said radiation so that some portions of said chalcogenide glass are thicker than other portions of said chalcogenide glass after said step of etching; and
transferring the three-dimensional pattern in said chalcogenide glass to said substrate.

19. Method of claim 18 wherein said substrate is transparent, and said three-dimensional pattern causes said substrate to act as a lens.

20. Method for using a gray scale mask, said gray scale mask comprising a thickness modulated chalcogenide glass layer, said method comprising irradiating a resist layer through said thickness modulated chalcogenide glass layer to thereby transfer the thickness pattern in said chalcogenide glass layer to said resist layer.

21. Method of claim 20 wherein said resist layer is another chalcogenide glass layer.

22. Method for using a gray scale mask, said gray scale mask comprising a chalcogenide glass layer having thickness information engraved therein, said method comprising irradiating a resist layer through said chalcogenide glass layer to thereby transfer a thickness pattern corresponding to said thickness information to said resist layer.

23. Method of claim 22 wherein said gray scale information is encoded in said chalcogenide layer by providing pixels in said chalcogenide layer.

24. Method of claim 1 wherein said gray scale pattern comprises a set of openings in said silver-diffused chalcogenide glass, the proportion of the area of said openings relative to the proportion of said area covered with silver-diffused chalcogenide glass representing the thickness of a structure being constructed.

25. Method of claim 24 wherein said chalcogenide glass comprises a series of column structures arranged perpendicularly to said substrate.

26. Method of claim 25 wherein said column structures prevent undercutting during said step of etching the uncovered chalcogenide glass.

27. Method of claim 24 wherein said gray scale pattern comprises a set of pixels, the density of said pixels representing said thickness.

28. Method of claim 24 wherein said gray scale pattern comprises a set of pixels, the size of said pixels representing said thickness.

29. Method of claim 14 wherein said radiation comprises ultraviolet light, x-rays or an e-beam.

30. A method of patterning a structure comprising a chalcogenide glass layer, said method comprising the steps of:

subjecting said structure comprising said chalcogenide glass layer to radiation; and etching said chalcogenide glass layer to vary the thickness of portions of said chalcogenide glass layer, wherein the amount of chalcogenide glass being removed during said step of etching is a function of the radiation which said chalcogenide glass layer is subjected to, the thickness of some portions of said chalcogenide glass being thicker than other portions of said chalcogenide glass after said step of etching.

31. Method of claim 30 wherein the chalcogenide glass comprises regions in which the thickness of said chalcogenide glass varies continuously.

32. Method of claim 30 wherein said chalcogenide glass layer is formed on a substrate, said method further comprising the step of transferring the variation of thickness in said portions of said chalcogenide glass layer to said substrate.

33. Method of claim 32 wherein said substrate is transparent, and wherein at the conclusion of said step of transferring, said substrate is a diffractive lens.

34. Method of claim 19 wherein said lens is a blazed zone plate lens.

35. A structure comprising a substrate with a deposited layer of chalcogenide glass forming a gray scale pattern.

36. The structure of claim 35, wherein said chalcogenide glass comprises selenium.

37. The structure of claim 35, wherein said chalcogenide glass comprises germanium.

38. The structure of claim 35, wherein said layer of chalcogenide glass forming said gray scale pattern is diffused with silver.

39. Structure of claim 35 wherein said gray scale pattern comprises a set of openings in said chalcogenide glass, the proportion of the area of said openings relative to the proportion of said area covered with chalcogenide glass representing a thickness of a structure to be constructed.

40. Structure of claim 35 wherein said chalcogenide glass comprises a series of column structures arranged perpendicularly to said substrate.

41. Structure of claim 40 wherein said column structures prevent undercutting when etching the chalcogenide glass.

42. Structure of claim 35 wherein said gray scale pattern comprises a set of pixels, the density of said pixels representing a thickness of a structure to be constructed.

43. Structure of claim 35 wherein said gray scale pattern comprises a set of pixels, the size of said pixels representing a thickness of a structure to be constructed.

44. Structure of claim 40 wherein the thickness of said chalcogenide glass varies such that some portions of said chalcogenide glass are thicker than other portions of said chalcogenide glass, said variation in thickness representing said gray scale pattern.

45. Structure of claim 35 wherein said substrate is transparent.

46. Structure comprising a chalcogenide glass layer, the thickness of said chalcogenide glass layer varying so that the chalcogenide glass at some portions of said layer is thicker than the chalcogenide glass at other portions of said layer, the thickness of said chalcogenide glass layer representing the topography of a structure being constructed.

47. Structure of claim 46 wherein said chalcogenide glass layer comprises regions in which the height of said chalcogenide glass layer varies continuously.

48. Structure of claim 46 wherein said chalcogenide glass layer is formed on a transparent substrate.

49. Structure of claim 48 wherein said substrate is glass.

50. Structure of claim 48 wherein the topography of said chalcogenide glass layer represents a diffractive lens being constructed.

* * * * *